US009000461B2

(12) United States Patent
Han et al.

(10) Patent No.: US 9,000,461 B2

(45) Date of Patent: Apr. 7, 2015

(54) OPTOELECTRONIC ELEMENT AND MANUFACTURING METHOD THEREOF

(75) Inventors: Cheng-Nan Han, Jiadong Township (TW); Tsung-Xian Lee, Zhudong Township (TW); Min-Hsun Hsieh, Hsinchu (TW); Hung-Hsuan Chen, Yilan (TW); Hsin-Mao Liu, Hsinchu (TW); Hsing-Chao Chen, New Taipei (TW); Ching-San Tao, Hsinchu (TW); Chih-Peng Ni, Caotun Township (TW); Tzer-Perng Chen, Hsinchu (TW); Jen-Chau Wu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 38 days.

(21) Appl. No.: 13/205,987

(22) Filed: Aug. 9, 2011

(65) Prior Publication Data

US 2011/0291145 A1 Dec. 1, 2011

Related U.S. Application Data

(63) Continuation-in-part of application No. 11/674,371, filed on Feb. 13, 2007, which is a continuation-in-part of application No. 11/249,680, filed on Oct. 12, 2005, now Pat. No. 7,192,797, application No. 13/205,987, which is a continuation-in-part of application No. 12/840,848, filed on Jul. 21, 2010, which is a continuation-in-part of application No. 11/160,588, filed on Jun. 29, 2005, now Pat. No. 7,928,455, which is a continuation-in-part of application No. 10/604,245, filed on Jul. 4, 2003, now Pat. No. 6,987,287.

(30) Foreign Application Priority Data

Jul. 21, 2009 (TW) ............................... 98124681 A
Dec. 30, 2009 (TW) ............................... 98146171 A

(51) Int. Cl.

| | |
|---|---|
| ***H01L 33/46*** | (2010.01) |
| ***H01L 33/00*** | (2010.01) |
| ***H01L 33/20*** | (2010.01) |
| *H01L 33/38* | (2010.01) |
| *H01L 33/48* | (2010.01) |
| *H01L 33/58* | (2010.01) |

(52) U.S. Cl.

CPC ............ *H01L 33/0079* (2013.01); *H01L 33/20* (2013.01); *H01L 33/46* (2013.01); *H01L 33/38* (2013.01); *H01L 33/486* (2013.01); *H01L 33/58* (2013.01); *H01L 2933/0016* (2013.01); *H01L 2924/0002* (2013.01)

(58) Field of Classification Search

CPC ................................ H01L 33/46; H01L 33/20
USPC ................ 257/79, E33.055–E33.059; 438/27
See application file for complete search history.

(56) References Cited

U.S. PATENT DOCUMENTS

| | | | | |
|---|---|---|---|---|
| 5,886,401 | A | 3/1999 | Liu | |
| 2001/0024087 | A1* | 9/2001 | Suehiro et al. | 313/512 |
| 2005/0211989 | A1* | 9/2005 | Horio et al. | 257/79 |
| 2006/0261364 | A1* | 11/2006 | Suehiro et al. | 257/100 |
| 2007/0253667 | A1* | 11/2007 | Brunner et al. | 385/92 |
| 2008/0179611 | A1 | 7/2008 | Chitnis et al. | |

* cited by examiner

*Primary Examiner* — Ermias Woldegeorgis

(74) *Attorney, Agent, or Firm* — Ditthavong & Steiner, P.C.

(57) ABSTRACT

An optoelectronic element includes an optoelectronic unit having a first top surface, a first bottom surface opposite to the first top surface, and a lateral surface between the first top surface and the first bottom surface; a first transparent structure covering the lateral surface and exposing the first top surface of the optoelectronic unit; a first insulating layer on the first top surface and the first transparent structure; a second insulating layer on the first insulating layer; a first opening through the first insulating layer and the second insulating layer; and a first conductive layer on the second insulating layer and electrically connecting to the optoelectronic unit via the first opening.

20 Claims, 7 Drawing Sheets

OPTOELECTRONIC ELEMENT AND MANUFACTURING METHOD THEREOF

RELATED APPLICATION

This application is a continuation-in-part application of U.S. patent application of Ser. No. 11/674,371, filed on Feb. 13, 2007, which is a continuation-in-part application of U.S. patent application of Ser. No. 11/249,680, filed on Oct. 12, 2005, and the contents of which are incorporated herein by reference.

This application is a continuation-in-part application of Ser. No. 12/840,848, filed Jul. 21, 2010, which is a continuation-in-part application of Ser. No. 11/160,588, filed Jun. 29, 2005, which is a continuation-in-part application of Ser. No. 10/604,245, filed Jul. 4, 2003, and claims the right of priority based on Taiwan application Ser. No. 098124681, filed Jul. 21, 2009, and Taiwan application Ser. No. 098146171, filed Dec. 30, 2009, and the content of which is hereby incorporated by reference.

BACKGROUND

1. Technical Field

The present disclosure relates to an optoelectronic element, and more particularly, to an optoelectronic element having a conductive structure.

2. Description of the Related Art

An optoelectronic element, such as a light-emitting diode (LED) package, has been applied widely in optical display devices, traffic signals, data storing devices, communication devices, illumination devices, and medical apparatuses. Similar to the trend of small and slim commercial electronic product, the development of the optoelectronic element also enters into an era of miniature package. One promising packaging design for semiconductor and optoelectronic element is the Chip-Level Package (CLP).

SUMMARY OF THE DISCLOSURE

An optoelectronic element includes an optoelectronic unit having a first top surface, a first bottom surface opposite to the first top surface, and a lateral surface between the first top surface and the first bottom surface; a first transparent structure covering the lateral surface and exposing the first top surface of the optoelectronic unit; a first insulating layer on the first top surface and the first transparent structure; a second insulating layer on the first insulating layer; a first opening through the first insulating layer and the second insulating layer; and a first conductive layer on the second insulating layer and electrically connecting to the optoelectronic unit via the first opening.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1A:
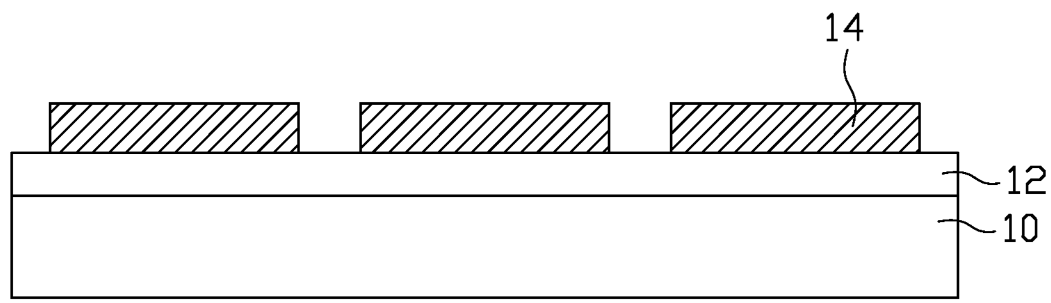
FIGS. 1A-1C illustrate flow charts of a manufacturing process of optoelectronic elements in accordance with an embodiment of the present application.
Figure 1B:
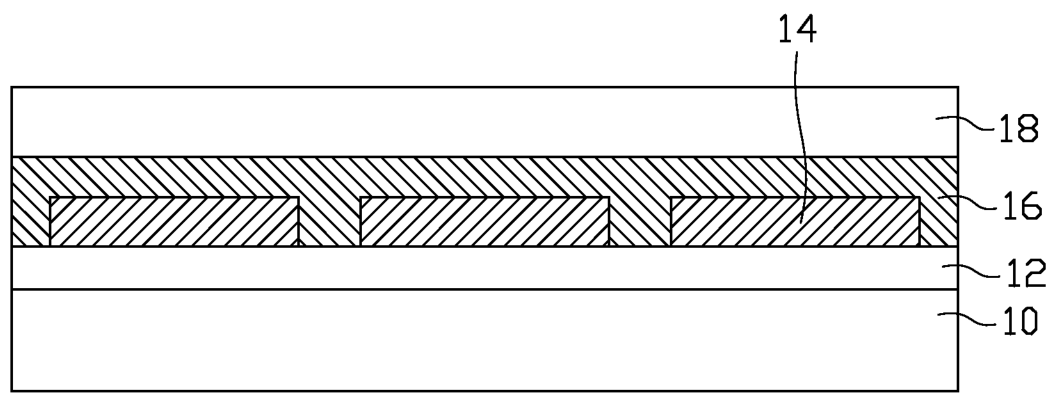
Figure 1C:
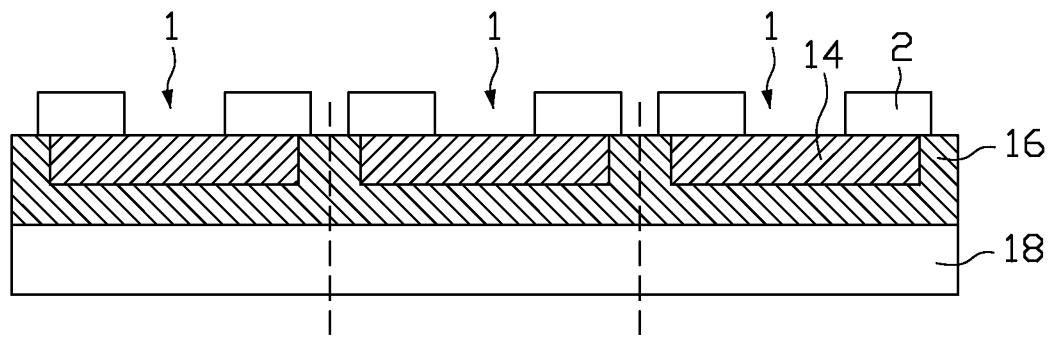

FIGS. 1A-1C disclose flow charts of a manufacturing process of optoelectronic elements 1 according to an embodiment of the present application. Referring to FIG. 1A, there is a wafer including a temporary carrier 10; a bonding layer 12 formed on the temporary carrier 10; and a plurality of optoelectronic units 14 formed on the bonding layer 12. Referring to FIG. 1B, a first transparent structure 16 is formed on the bonding layer 12 and the plurality of optoelectronic units 14. The first transparent structure 16 can cover more than one surface of at least one of the plurality of optoelectronic units 14. A second transparent structure 18 is formed on the first transparent structure 16. Referring to FIG. 1C, the temporary carrier 10 and the bonding layer 12 are removed, and a plurality of conductive structures 2 is formed on the surfaces of the plurality of optoelectronic units 14 and the first transparent structure 16. The wafer can be separated to form the plurality of optoelectronic elements 1.

The temporary carrier 10 and the second transparent structure 18 can support the optoelectronic unit 14 and the first transparent structure 16. The material of the temporary carrier 10 includes conductive material such as Diamond Like Carbon (DLC), graphite, carbon fiber, Metal Matrix Composite (MMC), Ceramic Matrix Composite (CMC), Polymer Matrix Composite (PMC), Ni, Cu, Al, Si, ZnSe, GaAs, SiC, GaP, GaAsP, ZnSe, InP, $LiGaO_2$, $LiAlO_2$, or the combination thereof, or insulating material such as sapphire, diamond, glass, epoxy, quartz, acryl, $Al_2O_3$, ZnO, MN, or the combination thereof.

The second transparent structure 18 can be transparent to the light emitted from the optoelectronic unit 14. The material of the second transparent structure 18 can be transparent material such as sapphire, diamond, glass, epoxy, quartz, acryl, $SiO_2$, $Al_2O_3$, ZnO, silicone, or the combination thereof. In addition, the second transparent structure 18 can also be transparent to the light, like the sunlight, from the environment in another embodiment. A thickness of the second transparent structure 18 is about 300 μm to 500 μm.

The bonding layer 12 can adhesively connect the temporary carrier 10 with the optoelectronic unit 14, and be easily removed after the second transparent structure 18 is formed on the first transparent structure 16. The material of the bonding layer 12 can be insulating material, UV tape, or thermal release tape. The insulating material includes but is not limited to benzocyclobutene (BCB), Su8, epoxy, or spin-on-glass (SOG).

The first transparent structure 16 covers the optoelectronic units 14 to fix and support the optoelectronic units 14 and enhances the mechanical strength of the optoelectronic elements 1. The first transparent structure 16 can be transparent to the light emitted from the optoelectronic unit 14. The material of the first transparent structure 16 and the second transparent structure 18 can be the same or different. The coefficient of thermal expansion (CTE) of the first transparent structure 16 is about 50 ppm/° C.~400 ppm/° C. The material of the first transparent structure 16 can be transparent material such as epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, fluorocarbon polymer, glass, $Al_2O_3$, SINR, SOG, or the combination thereof. The refractive indices of the first transparent structure 16 and the second transparent structure 18 can be the same or different. A thickness of the first transparent structure 16 is about 200 μm to 300 μm. In addition, the first transparent structure 16 can be transparent to the light from the environment such as the sunlight as well.

The optoelectronic unit 14 provides luminous energy, electric energy, or both, such as the LED or the solar cell. A thickness of the optoelectronic unit 14 is about 100 μm. When the optoelectronic unit 14 is the LED for emitting light, the refractive index of the first transparent structure 16 is larger than that of the second transparent structure 18 to increase the probability of extracting the light out of the optoelectronic element 1. When the optoelectronic unit 14 is the solar cell for absorbing light, the refractive index of the first transparent structure 16 is smaller than that of the second transparent structure 18 to increase the probability of the light entering the optoelectronic element 1.

Figure 2A:
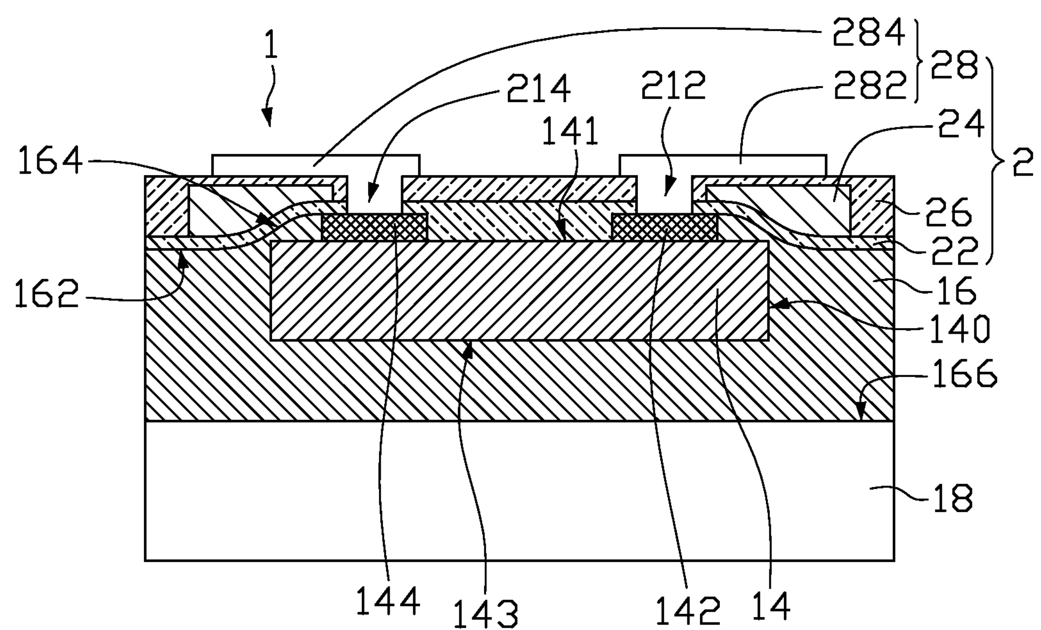
FIG. 2A illustrates a cross-sectional view of an optoelectronic element in accordance with an embodiment of the present application.

Referring to FIG. 2A which shows a cross-sectional view of an optoelectronic element 1 in accordance with an embodiment of the present application, the optoelectronic element 1 includes the second transparent structure 18; the first transparent structure 16 on the second transparent structure 18; the optoelectronic unit 14 on the first transparent structure 16; and the conductive structure 2 on the optoelectronic unit 14 and the first transparent structure 16. The optoelectronic unit 14 includes a first metal layer 142 and a second metal layer 144 formed on a first top surface 141; a first bottom surface 143 opposite to the first top surface 141 and close to the second transparent structure 18; and more than one lateral surface 140 between the first top surface 141 and the first bottom surface 143. The conductive structure 2 includes a first insulating layer 22 formed on the optoelectronic unit 14 and the first transparent structure 16 and covering portions of the first metal layer 142 and the second metal layer 144; a reflective layer 24 formed on the first insulating layer 22; a second insulating layer 26 formed on the first insulating layer 22 and the reflective layer 24 and covering the reflective layer 24; a first opening 212 and a second opening 214 formed in the first insulating layer 22 and the second insulating layer 26 to expose the first metal layer 142 and the second metal layer 144 respectively; and an electrode 28 including a first conductive layer 282 and a second conductive layer 284 which are formed on the second insulating layer 26, and in the first opening 212 and the second opening 214 to electrically connect with the first metal layer 142 and the second metal layer 144 respectively.

The first insulating layer 22 can electrically isolate the optoelectronic unit 14 from the reflective layer 24 and protect the optoelectronic unit 14 from being damaged by the element diffused from the material of the reflective layer 24. The first transparent structure 16 includes a second top surface 162 under the first insulating layer 22 and a second bottom surface 166 close to the second transparent structure 18. The second top surface 162 is substantially lower than the first top surface 141. However, the second top surface 162 includes a slope 164 adjacent to the first top surface 141. It is better that the slope 164 can be located over a region of the first top surface 141 between the first and the second metal layers 142 and 144 and the lateral surface 140. Moreover, a distance between a portion of the second top surface 162 and the second bottom surface 166 can be the same as that between the second bottom surface 166 and the first top surface 141 in another embodiment.

The first insulating layer 22 can be adhesive to the first transparent structure 16 and/or to the reflective layer 24. The transparency of the first insulating layer 22 to the light emitted from the optoelectronic unit 14 and/or from the environment is higher than 85%. The CTE of the first insulating layer 22 is smaller than that of the first transparent structure 16. The CTE of the first insulating layer 22 can be between that of the first transparent structure 16 and the reflective layer 24 preferably. The CTE of the first insulating layer 22 is about 3 ppm/° C. to 200 ppm/° C., preferably 20 ppm/° C. to 70 ppm/° C. The material of the first insulating layer 22 can be the same as or different from that of the first transparent structure 16. The material of the first insulating layer 22 can be photoresist material for forming the openings so the first insulating layer 22 needs to be cured in the lithography process. The curing temperature of the first insulating layer 22 is not more than 350° C. to avoid damaging the first transparent structure 16 in high temperature. The photoresist material includes but is not limited to AL-polymer, BCB, SINR, Su8, or SOG. The first insulating layer 22 can include a rough surface with a roughness higher than that of the first top surface 141. A thickness of the first insulating layer 22 is substantially constant, for example, about 2 μm to 3 μm.

The reflective layer 24 can reflect the light emitted from the optoelectronic unit 14 or from the environment. A thickness of the reflective layer 24 is substantially constant, for example, about 1 μm to 3 μm. The reflective layer 24 overlaps portions of the first metal layer 142 and the second metal layer 144. The reflective layer 24 can further include a plurality of sub-layers (not shown). The CTE of the reflective layer 24 is about 5 ppm/° C. to 25 ppm/° C. The reflective layer 24 can have a reflectivity of 70% or above to the light emitted from the optoelectronic unit 14 and/or from the environment. The material of the reflective layer 24 includes but is not limited to metal material such as Cu, Al, Sn, Au, Ag, Ti, Ni, Ag—Ti, Ni—Sn, Au alloy, Ni—Ag, Ti—Al, and so on. The reflective layer 24 can include a rough surface with a roughness higher than that of the first top surface 141.

The second insulating layer 26 can electrically isolate the first conductive layer 282 and the second conductive layer 284 from the reflective layer 24, and protect the reflective layer 24 from being damaged by the first conductive layer 282 and the second conductive layer 284. The second insulating layer 26 can fix the reflective layer 24 and enhances the mechanical strength of the conductive structure 2 as well. The material of the second insulating layer 26 can be the same as and/or different from that of the first insulating layer 22. The material of the second insulating layer 26 includes but is not limited to photoresist material such as AL-polymer, BCB, SINR, Su8, SOG, PI, or DLC. The second insulating layer 26 can include a rough surface with a roughness higher than that of the first top surface 141. A thickness of the second insulating layer 26 is substantially constant, for example, about 4 μm to 5 μm.

The electrode 28 can be integrally formed by evaporation or electroplating. The ratio of the top surface area of the electrode 28 to that of the second transparent structure 18 is not smaller than 50%. The first conductive and second conductive layers 282 and 284 are for receiving external voltage. The material of the first conductive and second conductive layers 282 and 284 can be metal material. The metal material includes but is not limited to Cu, Sn, Au, Ni, Ti, Pb, Cu—Sn, Cu—Zn, Cu—Cd, Sn—Pb—Sb, Sn—Pb—Zn, Ni—Sn, Ni—Co, Au alloy, Au—Cu—Ni—Au, the combination thereof, and so on. The first conductive layer 282 and/or the second conductive layer 284 can include a plurality of sublayers (not shown). The first conductive layer 282 and/or the second conductive layer 284 can have a reflectivity of 70% or above to the light emitted from the optoelectronic unit 14 and/or from the environment. A thickness of the first conductive layer 282 is a substantially constant, for example, about 12 μm. A thickness of the second conductive layer 284 is substantially constant, for example, about 12 μm. The ratio of the top surface area of the first conductive layer 282 and the second conductive layer 284 to the area of the second bottom surface 166 is more than 50%.

Figure 2B:
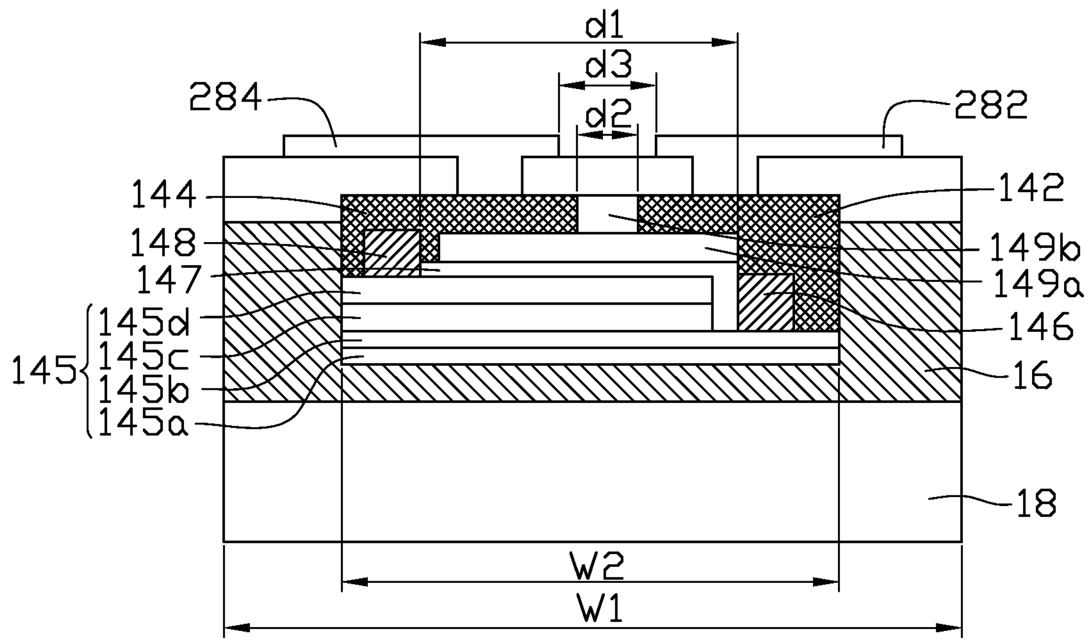
FIG. 2B illustrates a cross-sectional view of the optoelectronic unit shown in FIG. 2A.

The optoelectronic unit 14 can be an LED including a light emitting structure 145, a first dielectric layer **149*a*, a passivation layer 147, a first bonding pad 146, a second bonding pad 148, the first metal layer 142, the second metal layer 144, and a second dielectric layer 149*b*, as FIG. 2B shows. The light emitting structure 145 includes a substrate 145*a*, a first conductive layer 145*b*, an active layer 145*c*, and a second conductive layer 145*d*. The active layer 145*c* is disposed on the first conductive layer 145*b* and is a light emitting layer. The second conductive layer 145*d* is disposed on the active layer 145*c*. The first bonding pad 146 is disposed on the light emitting structure 145 and is electrically connected to the first conductive layer 145*b*. The second bonding pad 148 is disposed on the light emitting structure 145 and is electrically connected to the second conductive layer 145*d*. The passivation layer 147 is disposed on the light emitting structure 145 and isolates the first bonding pad 146 from the active layer 145*c* and the second conductive layer 145*d*. The first dielectric layer 149*a* is disposed on the light emitting structure 145. The first metal layer 142 is disposed on the light emitting structure 145 and is electrically connected to the first conductive layer 145*b*. A portion of the first metal layer 142 is disposed on the first dielectric layer 149*a*. The second metal layer 144 is disposed on the light emitting structure 145 and is electrically connected to the second conductive layer 145*d*. A portion of the second metal layer 144 is disposed on the first dielectric layer 149*a*. The second dielectric layer 149*b* is disposed on the first dielectric layer 149*a*. The first dielectric layer 149*a* and the second dielectric layer 149*b* electrically isolate the first metal layer 142 from the second metal layer 144. A portion of the first dielectric layer 149*a* is a transparent layer, and a surface of the first dielectric layer 149*a* contacting the first metal layer 142 and/or the second metal layer 144 is for reflecting the light emitted from the light emitting structure 145. The first dielectric layer 149*a*** can include a reflective structure in another embodiment. The reflective structure includes distributed bragg reflector (DBR) and/or a reflective film. The reflective film can includes metal material such as Cu, Al, Sn, Au, Ag, Ti, Ni, Ag—Ti, Ni—Sn, Au alloy, Ni—Ag, Ti—Al, and so on.

There are a first distance d1 between the first bonding pad 146 and the second bonding pad 148, a second distance d2 between the first metal layer 142 and the second metal layer 144, and a third distance d3 between the first conductive layer 282 and the second conductive layer 284, as FIG. 2B shows. The first distance d1 is larger than the second distance d2 and the third distance d3. The second distance d2 and the third distance d3 can be the same or difference. The second distance d2 is larger than the third distance d3 in an embodiment. The second distance d2 can also be smaller than the third distance d3 in another embodiment. The third distance d3 is about 100 μm to 300 μm. The second transparent structure 18 contains a first width w1 and the optoelectronic unit 14 contains a second width w2. The ratio of the first width w1 to the second width w2 is about 1.5 to 3, preferably 2 to 2.5.

Figure 2C:
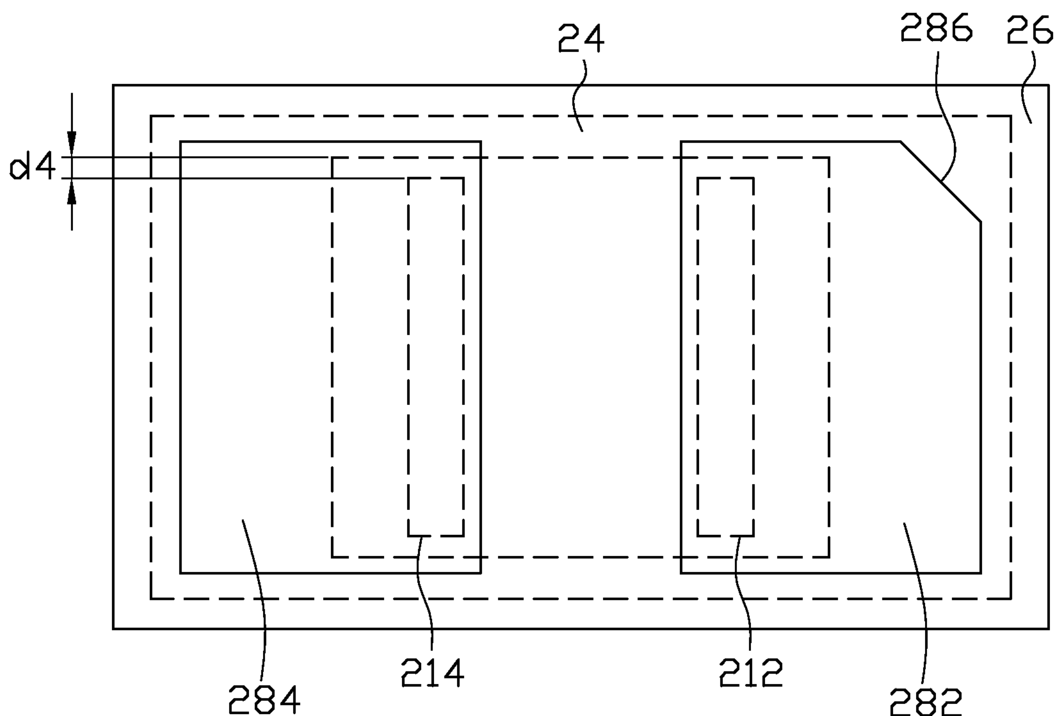
FIG. 2C illustrates a top view of the optoelectronic element shown in FIG. 2A.

Referring to FIG. 2C which shows a top view of the optoelectronic element 1 shown in FIG. 2A, the first conductive layer 282 contains a truncated corner 286 at a side far from the second conductive layer 284. There is a forth distance d4 between the first opening 212 and the reflective layer 24 that is about 25 μm to 75 μm.

The optoelectronic element 1 can be bonded to a submount through an adhesive material in another embodiment. The adhesive material can be metal material, transparent material, or an anisotropic conductive film. The metal material includes but is not limited to Cu, Sn, Au, Ni, Ti, Pb, Cu—Sn, Cu—Zn, Cu—Cd, Sn—Pb—Sb, Sn—Pb—Zn, Ni—Sn, Ni—Co, Au alloy, Au—Cu—Ni—Au, or the combination thereof. The transparent material includes but is not limited to BCB, Sub, epoxy, or SOG.

Figure 3A:
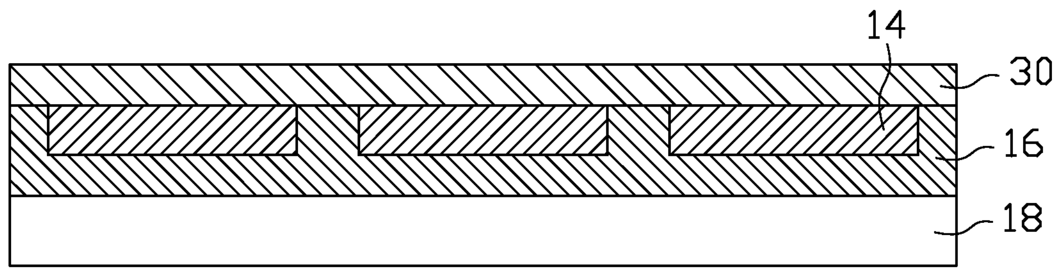
FIGS. 3A-3F illustrate flow charts of a manufacturing process of electroplating an electrode on optoelectronic elements in accordance with an embodiment of the present application.
Figure 3B:
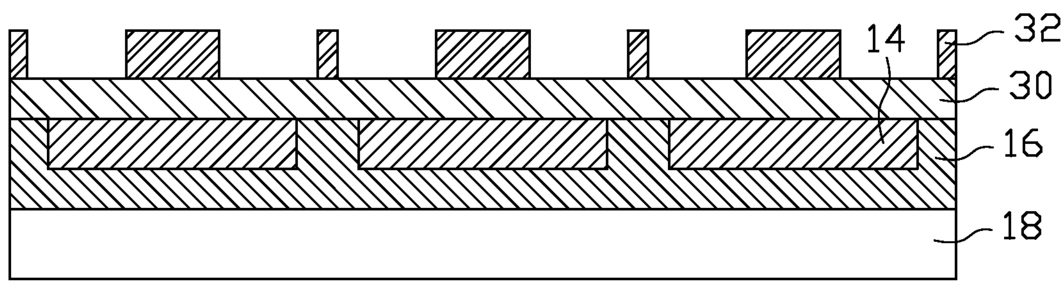
Figure 3C:
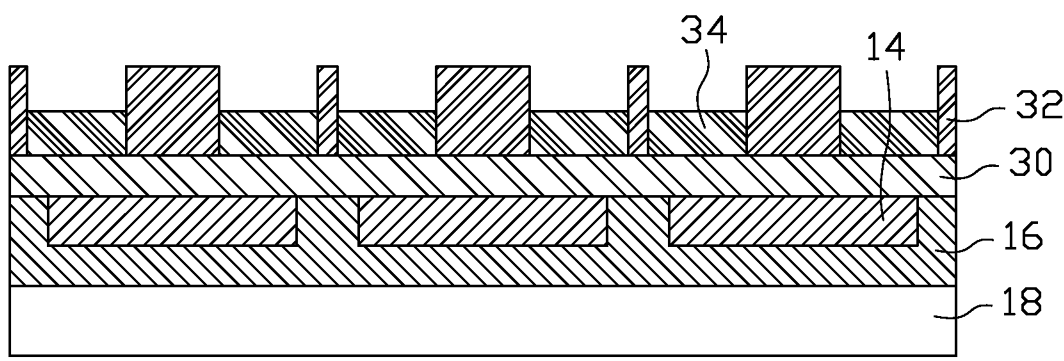
Figure 3D:
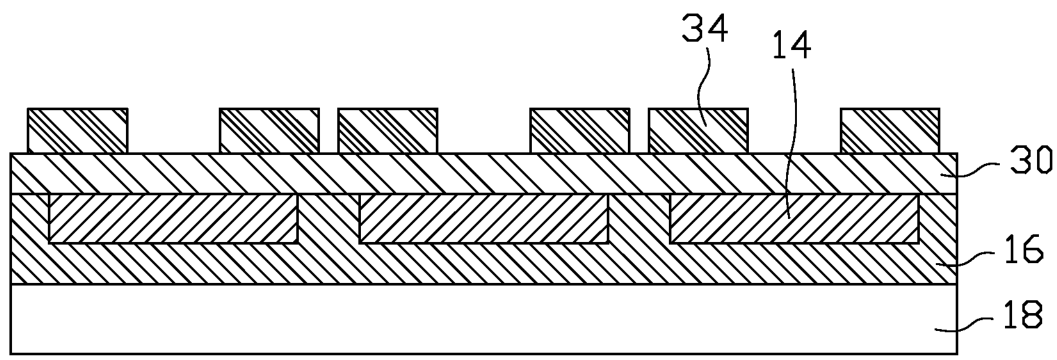
Figure 3E:
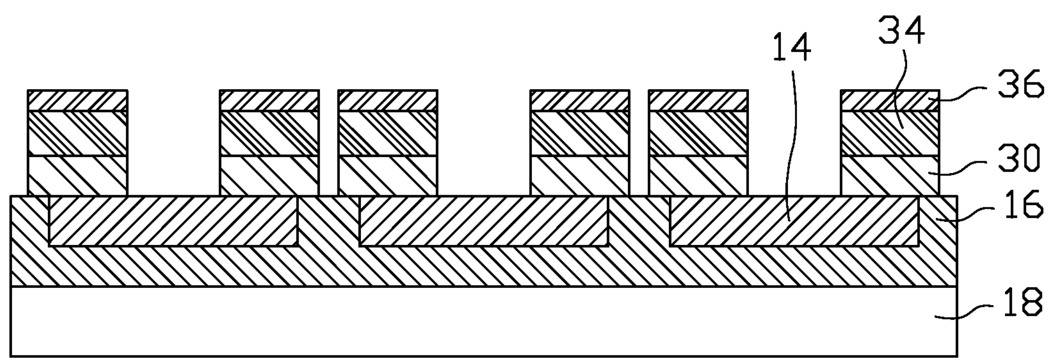
Figure 3F:
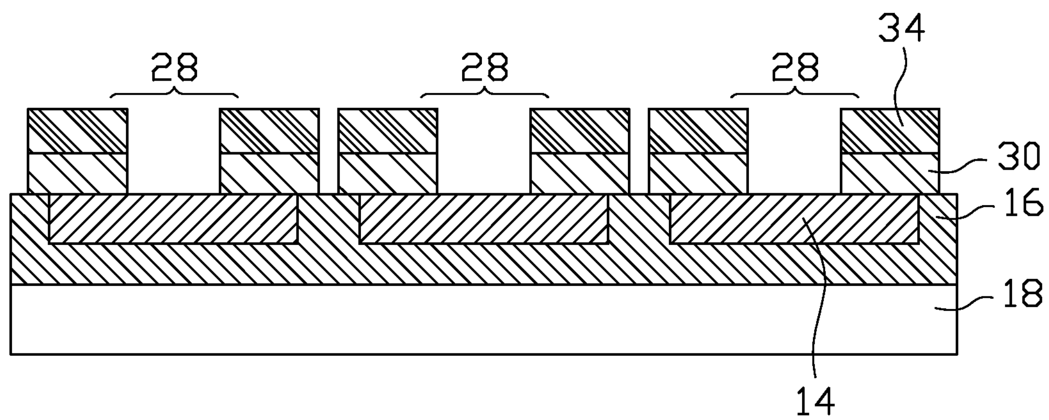

FIGS. 3A-3F disclose flow charts of a manufacturing process of electroplating the electrode 28 on the optoelectronic unit 14. Referring to FIG. 3A, a seed layer 30 is formed on the optoelectronic units 14 and the first transparent structure 16. A first photoresist 32 is formed on the seed layer 30 to expose portions of the seed layer 30, as FIG. 3B shows. An electroplating layer 34 is electroplated on the portions of the seed layer 30 where the first photoresist 32 does not cover, as FIG. 3C shows. Referring to FIG. 3D, the first photoresist 32 is removed to expose other portions of the seed layer 30. A second photoresist 36 is formed on the electroplating layer 34. Then, the exposed portions of the seed layer 30 is removed, as FIG. 3E shows. The second photoresist 36 is removed to expose the electroplating layer 34 for forming the electrode 28, referring to FIG. 3F.

Figure 4:
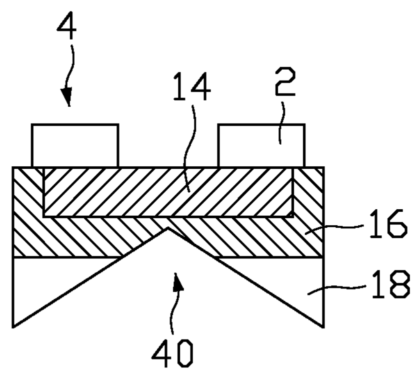
FIG. 4 illustrates a cross-sectional view of an optoelectronic element in accordance with another embodiment of the present application.

Referring to FIG. 4 which shows a cross-sectional view of an optoelectronic element 4 in accordance with another embodiment of the present application, the optoelectronic element 4 is similar to the optoelectronic element 1 and further includes a recess 40 formed in the second transparent structure 18 such that the second transparent structure 18, as an optical element, can process the light emitted from the optoelectronic unit 14 or from the environment. The recess 40 can be further formed in the first transparent structure 16. The shape of the recess 40 can be triangle in the cross-sectional view in this embodiment.

Figure 5:
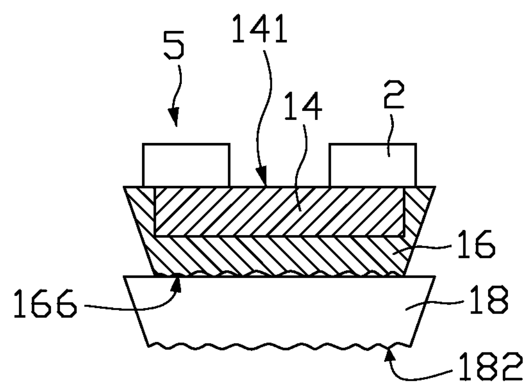
FIG. 5 illustrates a cross-sectional view of an optoelectronic element in accordance with another embodiment of the present application.

Referring to FIG. 5, the second transparent structure 18 of an optoelectronic element 5 can be trapezoid in another embodiment. The second transparent structure 18 further includes a third bottom surface 182. The third bottom surface 182 can be a rough surface with a roughness higher than that of the first top surface 141, or a flat surface. The shape of the second transparent structure 18 includes but is not limited to triangle, semicircle, quarter circle, trapezoid, pentagon, or rectangle in the cross-sectional view. The first transparent structure 16 can also include the same or different shape of the second transparent structure 18. The second bottom surface 166 can also be a rough surface with a roughness higher than that of the first top surface 141, or a flat surface in another embodiment.

Figure 6:
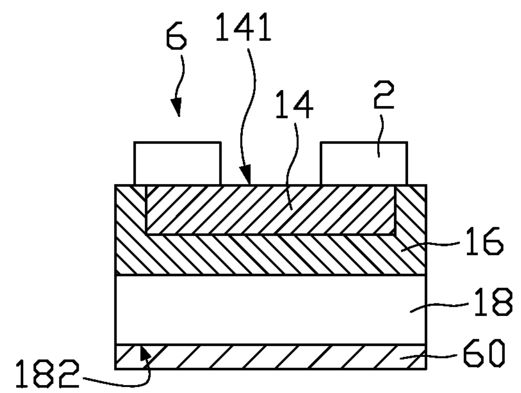
FIG. 6 illustrates a cross-sectional view of an optoelectronic element in accordance with another embodiment of the present application.
Figure 7:
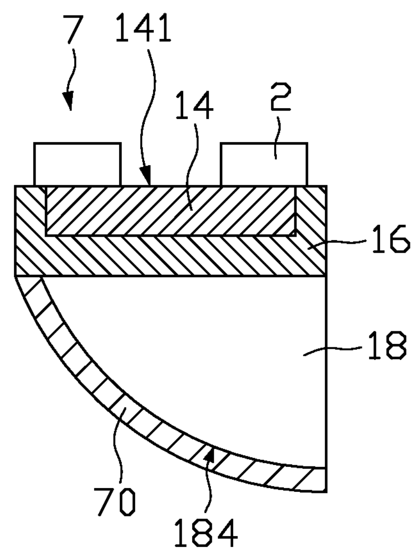
FIG. 7 illustrates a cross-sectional view of an optoelectronic element in accordance with another embodiment of the present application.
Figure 8:
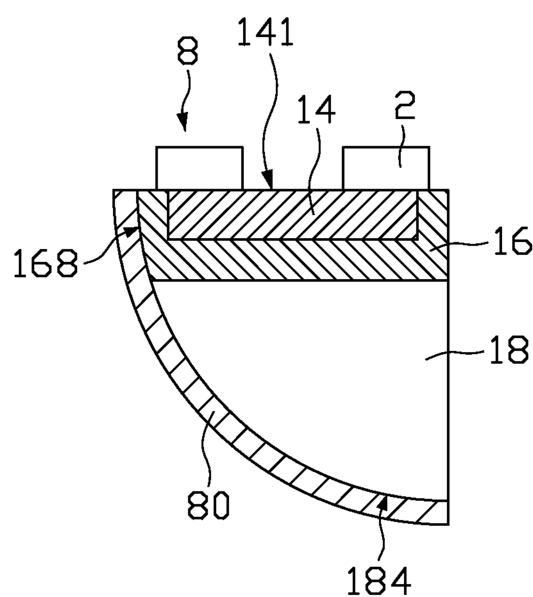
FIG. 8 illustrates a cross-sectional view of an optoelectronic element in accordance with another embodiment of the present application.

An optoelectronic element 6 is similar to the optoelectronic element 5 and further includes a mirror 60 formed under the third bottom surface 182, as FIG. 6 shows. The mirror 60 can reflect the light emitted from the optoelectronic unit 14 or from the environment. Referring to FIG. 7, an optoelectronic element 7 includes the optoelectronic unit 14, the conductive structure 2, the first transparent structure 16, and the second transparent structure 18. The second transparent structure 18 contains a first side 184 which is not parallel to the first top surface 141 and a mirror 70 is formed under the first side 184 to reflect light emitted from the optoelectronic unit 14 or from the environment, in another embodiment. The first side 184 can be parabolic curve, arc, or bevel to the first top surface 141 in the cross-sectional view, for example. In another embodiment, an optoelectronic element 8 is similar to the optoelectronic element 7 and the first transparent structure 16 further includes a second side 168 which is not parallel to the first top surface 141, as FIG. 8 shows. A mirror 80 is formed under the first side 184 and the second side 168 to reflect light emitted from the optoelectronic unit 14 or from the environment.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. An optoelectronic element, comprising:
an optoelectronic unit comprising a first metal layer, a lateral surface, and a top surface which comprises a portion not covered by the first metal layer;
a first transparent structure covering the lateral surface;
a first conductive layer arranged on the top surface and electrically connected to the first metal layer; and
a reflective layer arranged on the top surface and comprising:
a first portion overlapping the portion and the first conductive layer; and
a second portion overlapping the first conductive layer and the first transparent structure and not overlapping the first portion.

2. The optoelectronic element of claim 1, further comprising an insulating layer arranged between the first conductive layer and the optoelectronic unit.

3. The optoelectronic element of claim 2, wherein the insulating layer surrounds the reflective layer.

4. The optoelectronic element of claim 1, wherein the second portion is arranged between the first conductive layer and the first transparent structure.

5. The optoelectronic element of claim 1, wherein the second portion is wider than the first portion.

6. The optoelectronic element of claim 1, wherein the reflective layer comprises a surface having a roughness higher than that of the top surface.

7. The optoelectronic element of claim 1, further comprising a second transparent structure separated from the optoelectronic unit by the first transparent structure.

8. The optoelectronic element of claim 1, further comprising a second conductive layer having a width substantially equal to that of the first conductive layer.

9. The optoelectronic element of claim 1, further comprising an insulating layer arranged on the top surface and directly contacting the first conductive layer.

10. The optoelectronic element of claim 1, further comprising
a second metal layer separated from the first metal layer by a first distance; and
a second conductive layer arranged on the top surface and separated from the first metal layer by a second distance which is greater than the first distance,
wherein a distance between the first metal layer and the second metal layer is smaller than that between the first conductive layer and the second conductive layer.

11. An optoelectronic element, comprising:
an optoelectronic unit comprising a first metal layer, a lateral surface, and a top surface which comprises a portion not covered by the first metal layer;
a first transparent structure covering the lateral surface;
a first conductive layer arranged on the top surface and electrically connected to the first metal layer;
a reflective layer arranged on the top surface and comprising:
a first portion overlapping the portion and the first conductive layer; and
a second portion overlapping the first conductive layer and the first transparent structure; and
a second transparent structure separated from the optoelectronic unit by the first transparent structure.

12. The optoelectronic element of claim 11, further comprising an insulating layer arranged between the first conductive layer and the optoelectronic unit.

13. The optoelectronic element of claim 12, wherein the insulating layer surrounds the reflective layer.

14. The optoelectronic element of claim 11, wherein the second portion is arranged between the first conductive layer and the first transparent structure.

15. The optoelectronic element of claim 11, wherein the first transparent structure has a refractive index higher than that of the second transparent structure.

16. The optoelectronic element of claim 11, further comprising an insulating layer arranged on the top surface and directly contacting the first conductive layer.

17. The optoelectronic element of claim 11, further comprising:
a second metal layer separated from the first metal layer by a first distance; and
a second conductive layer arranged on the top surface and separated from the first metal layer by a second distance which is greater than the first distance.

18. The optoelectronic element, comprising:
an optoelectronic unit comprising a first metal layer, a lateral surface, and a top surface which comprises a portion not covered by the first metal layer;
a first transparent structure covering the lateral surface;
a first conductive layer arranged on the top surface and electrically connected to the first metal layer;
a reflective layer arranged on the top surface and comprising:
a first portion overlapping the portion and the first conductive layer; and
a second portion overlapping the first conductive layer and the first transparent structure; and
an insulating layer arranged between the first conductive layer and the optoelectronic unit.

19. The optoelectronic element of claim 18, further comprising a second transparent structure having a refractive index lower than that of the first transparent structure.

20. The optoelectronic element of claim 18, further comprising:

a second metal layer separated from the first metal layer by a first distance; and a second conductive layer arranged on the top surface and separated from the first metal layer by a second distance which is greater than the first distance.

* * * * *